(12) United States Patent
Deisher et al.

(10) Patent No.: US 7,804,920 B2
(45) Date of Patent: Sep. 28, 2010

(54) CLOSED LOOP ADAPTIVE CLOCK RFI MITIGATION

(75) Inventors: Michael E. Deisher, Hillsboro, OR (US); Keith R. Tinsley, Beaverton, OR (US); Chaitanya Sreerama, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 751 days.

(21) Appl. No.: 11/694,171

(22) Filed: Mar. 30, 2007

(65) Prior Publication Data

US 2008/0240313 A1 Oct. 2, 2008

(51) Int. Cl.
*H04B 1/10* (2006.01)
(52) U.S. Cl. ...................... 375/346; 455/296
(58) Field of Classification Search .................. 375/346, 375/377; 324/76.21; 331/2, 44, 46, 76; 368/10, 368/156; 455/114.1–114.3, 63.1, 278.1, 455/296, 310; 702/76
See application file for complete search history.

(56) References Cited

U.S. PATENT DOCUMENTS

| 5,706,256 | A | * | 1/1998 | Hood et al. | 368/10 |
|---|---|---|---|---|---|
| 5,745,848 | A | * | 4/1998 | Robin | 455/296 |
| 6,393,078 | B1 | * | 5/2002 | Sattler | 375/346 |
| 7,761,057 | B2 | | 7/2010 | Sreerama et al. | |
| 2002/0094034 | A1 | * | 7/2002 | Moriyama | 375/271 |
| 2003/0198307 | A1 | * | 10/2003 | Neill et al. | 375/346 |
| 2008/0081586 | A1 | * | 4/2008 | Sreerama et al. | 455/255 |
| 2008/0137786 | A1 | * | 6/2008 | Waltho | 375/346 |
| 2008/0137787 | A1 | * | 6/2008 | Soffer | 375/346 |
| 2008/0265968 | A1 | | 10/2008 | Furuichi | |
| 2009/0080498 | A1 | * | 3/2009 | Deisher et al. | 375/136 |
| 2009/0080583 | A1 | * | 3/2009 | Skinner et al. | 375/371 |
| 2009/0138745 | A1 | | 5/2009 | Dorsey et al. | |

OTHER PUBLICATIONS

Nehorai et al., Adaptive Comb Filtering for Harmonic Signal Enhancement, Oct. 1986, Acoustics, Speech and Signal Processing, IEEE Translation on, Issue 5, pp. 1124-1138.*
Non-Final Office Action received for U.S. Appl. No. 11/537,635, Mailed on Jul. 15, 2009, pp. 9.
Notice of Allowance received for U.S. Appl. No. 11/537,635, mailed on Dec. 21, 2009, 4 Pages.
Notice of Allowance received for U.S. Appl. No. 11/537,635, mailed on Mar. 3, 2010, 6 Pages.
Wang, "Radio Frequency Effects on the Clock Networks of Digital Circuits", International Symposium on Electromagnetic Compatibility, Publication Date: Aug. 9-13, 2004, vol. 1, pp. 93-96.

(Continued)

*Primary Examiner*—Tesfaldet Bocure
*Assistant Examiner*—Lawrence B Williams
(74) *Attorney, Agent, or Firm*—Grossman, Tucker, Perreault & Pfleger, PLLC (57) ABSTRACT

A method according to one embodiment for mitigating radio frequency interference by identifying system clocks, identifying active radio channels, measuring clock harmonics in or near the active radio channels, determining potential interference occurring if the clocks were moved to new fundamental frequencies, and shifting clock fundamental frequencies to reduce interference to the active radio channels based on existing interference and the potential interference of a plurality of new fundamental frequencies. Of course, many alternatives, variations, and modifications are possible without departing from this embodiment.

19 Claims, 11 Drawing Sheets

OTHER PUBLICATIONS

"Agilent 89600 series Vector Signal Analysis Software WiMAX (IEEE Std 802.16-2004)", Agilent Technologies, Demonstration Guide and Application Note, IEEE WiMax Committee, printed in U.S.A. on Jan. 5, 2006, 27 Pages.

Giridhar, et al., "Distributed Clock Synchronization over Wireless Networks: Algorithms and Analysis", Proceedings of the 45th IEEE Conference on Decision and Control (CDC '06), San Diego, California, USA, Dec. 2006, 7 pages.

"Part 16: Air Interface for Fixed Broadband Wireless Access Systems", IEEE Standard for Local and metropolitan area networks, IEEE Std 802.16, LAN/MAN Standards Committee of the IEEE Computer Society, Oct. 1, 2004, 895 pages.

"High Rate Ultra Wideband PHY and MAC Standard", Standard ECMA-368, Third Edition, Dec. 2008, 344 pages.

LAN/MAN Standards Committee of the IEEE Computer Society.; Part 11: Wireless LAN Medium Access Control (MAC) and Physical Layer (PHY) Specifications, Aug. 20, 1999, pp. 1-528, The Institute of Electrical and Electronics, Engineers, Inc., New York, New York.

LAN/MAN Standards Committee of the IEEE Computer Society.; Part 15.1: Wireless LAN Medium Access Control (MAC) and Physical Layer (PHY) Specifications for Wireless Personal Area Networks, Jun. 14, 2005, pp. 1-234, The Institute of Electrical and Electronics, Engineers, Inc., New York, New York.

\* cited by examiner

CLOSED LOOP ADAPTIVE CLOCK RFI MITIGATION

FIELD

The present disclosure relates to managing system clocks to reduce radio frequency interference (RFI), and more particularly, the present disclosure relates to adaptively adjusting system clock frequencies to reduce or eliminate RFI.

BACKGROUND

Wireless computing platforms may communicate using one or more wireless communication channels. With today's wireless platforms it is not possible to completely avoid platform RFI. Platform components typically include clocks that, during operation, may generate harmonics that overlap with the frequency range of at least one wireless channel. In some platforms, the close proximity of the clocks and wireless transceivers may introduce significant radio frequency interference (RFI) with one ore more wireless channels. The effect of the RFI may be to significantly reduce the bandwidth and/or operating range of the wireless channel.

If a system clock's fundamental frequencies are adjusted such that one radio channel is free of interfering harmonics, another radio channel may be severely degraded. Currently system clock frequencies are not adaptively adjustable for best radio performance based on radio frequency measurements. No existing mobile computing platforms make use of spectral measurements to adaptively minimize interference of system clock harmonics on radio communication via narrowband spectral analysis.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1A:
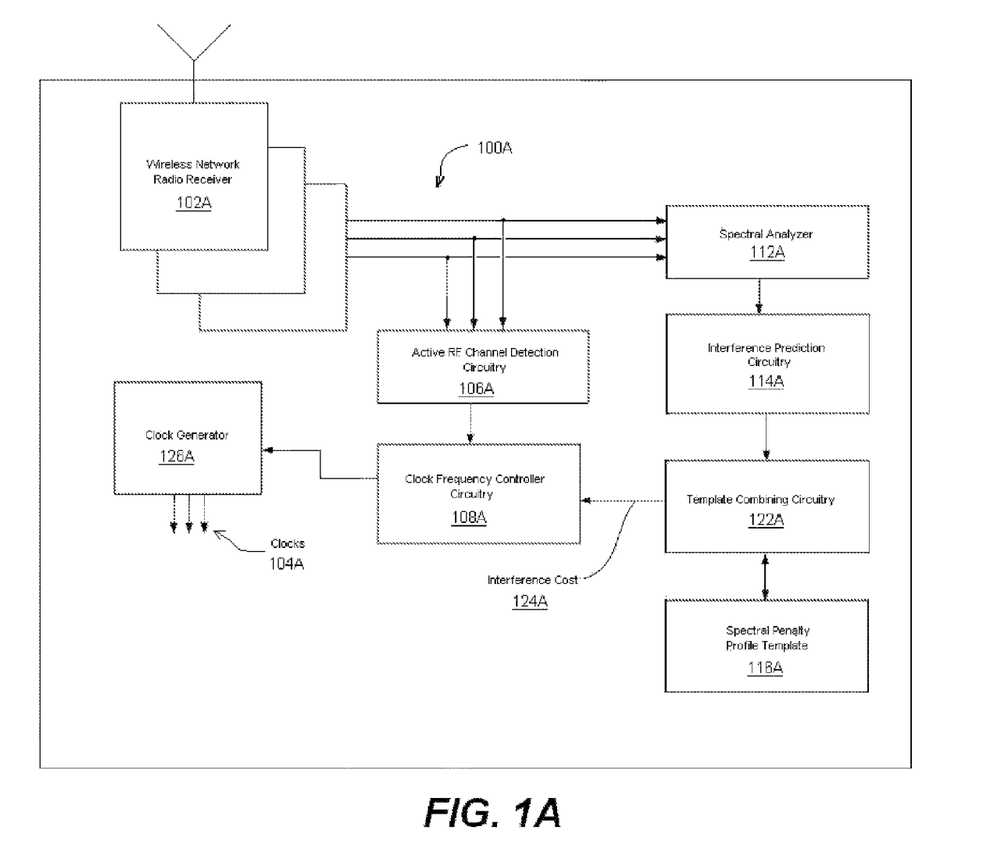
FIG. 1A is a block diagram of a system consistent with a first embodiment of the present disclosure.

FIG. 1A provides a block diagram of a wireless system 100A consistent with the present disclosure. The wireless system 100A may include a wireless platform, for example, a laptop computer, Palm® computer, Treo® handheld computer, cell phone, global positioning system (GPS), etc. Wireless system 100A may include at least one wireless network radio receiver 102A and at least one clock 104A, generated by clock generator 126A. The at least one wireless network radio receiver 102A may be configured for wireless communication using, for example 802.11a/b/g, BlueTooth, UWB, WiMax, and/or other wireless communication protocols. Each of these communication protocols may operate over a designated RF band (frequency range) and each RF band may include one or more possible active channels within the RF band. Accordingly, each wireless communication receiver 102A may be configured to receive at least one RF channel within at least one RF band.

Clocks 104A may include any system or sub-system clock, which may include, for example, CPU clock, memory clock, display clock, bus clock, and/or other system or subsystem clock etc. Thus, the term "clock" as used herein is intended to broadly cover any clock and/or strobe (for example bus strobe) associated with system 100A.

The wireless system 100A may also include active radio frequency (RF) channel detection circuitry 106A, clock frequency controller circuitry 108A, spectral analyzer circuitry 112A, and interference prediction circuitry 114A. In this embodiment, the frequencies, amplitudes, and spectral shapes of interfering clock harmonics are estimated by spectral analysis block 112A. Based on these estimated quantities, the interference prediction block 114A predicts the frequency, amplitudes, and spectral shapes of interfering clock harmonics for one more new fundamental frequencies of the clocks. The predicted interference spectra are weighted by applying spectral penalty templates 116 in the template combiner 122A. The instantaneous interference cost for each potential new clock fundamental frequency is calculated by the clock frequency controller 108A using the weighted, predicted interference spectra.

The system clock frequencies that minimize the total interference cost are calculated using methodology such as that described later herein, and are then chosen as target frequencies and reported to clock generator 126A. The clock generator is instructed to then shift the frequencies of system clocks 104A to the new target fundamental frequencies.

The active channel detection circuitry 106A may be configured to detect one or more active RF channels associated with one or more wireless network radio receivers 102A. As will be described in greater detail below, to reduce or eliminate RFI (noise) stemming from the harmonic content of at least one clock 104A, clock frequency controller 108A may be configured to adjust the frequency of at least one clock 104A based on, for example, the current active channel information. The clock frequency controller may have hysteresis or smoothing circuitry to prevent oscillation of the clock fundamental frequency over time.

Initially, platform radio frequency interference is received by the radio receiver 102A and converted to digital format, then forwarded to the narrowband spectral analyzer 112A, which extracts the interfering tones in the frequency bands of interest. The spectral template combiner 122A applies a spectral weighting template to the extracted tones which emphasizes tones that will cause the most damage to received signals of interest. The clock controller 108A computes a weighted cost of the interfering tones over the band of interest and determines if system clock fundamental frequency modification will decrease that weighted cost. The clock controller determines the system clock fundamental frequencies that result in minimum predicted cost and modifies the system clock generator 126A to move the system clock fundamental frequencies to the desired spectral position. This procedure may occur continuously as other processes in the system (such as power management, wireless network access, etc.) move system clock fundamental frequencies or receiver frequency bands of interest.

Figure 1B:
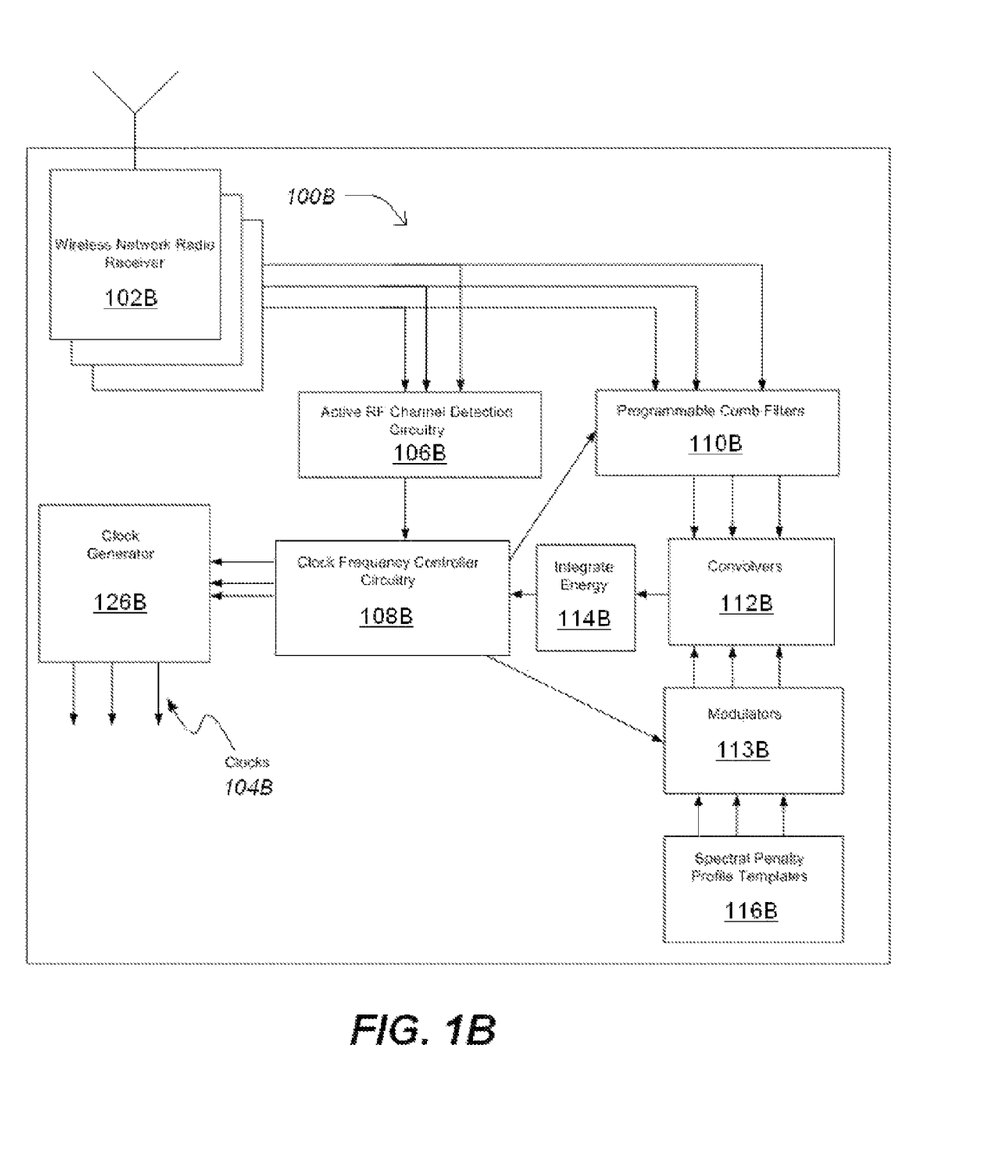
FIG. 1B is a block diagram of a system consistent with a second embodiment of the present disclosure.

A second wireless system 100B consistent with the present disclosure is shown in FIG. 1B, including an adaptive comb filter 110B. As in the first system, wireless system 100B may also include a wireless platform, for example, a laptop computer, Palm® computer, Treo® handheld computer, cell phone, global positioning system (GPS), etc. Wireless system 100B may include at least one wireless network radio receiver 102B and at least one clock 104B, generated by clock generator 126B. The at least one wireless network radio receiver 102B may be configured for wireless communication using, for example 802.11a/b/g, BlueTooth, UWB, WiMax, and/or other wireless communication protocols.

Similar to the first system, each of these communication protocols of system 100B may operate over a designated RF band (frequency range) and each RF band may include one or more possible active channels within the RF band. Accordingly, each wireless communication receiver 102B may be configured to receive at least one RF channel within at least one RF band. Also as in the first system, clocks 104B may include any system or sub-system clock, which may include, for example, CPU clock, memory clock, display clock, bus clock, and/or other system or subsystem clock etc. Thus, the term "clock" as used herein is intended to broadly cover any clock and/or strobe (for example bus strobe) associated with system 100B.

The wireless system 100B may also include active radio frequency (RF) channel detection circuitry 106B, clock frequency controller circuitry 108B, convolvers 112B, modulators 113B and integrate energy circuitry 114B. The system clock frequencies that minimize the total interference cost are calculated using methodology such as that described later herein, and are then chosen as target frequencies and reported to clock generator 126B. The clock generator is instructed to then shift the frequencies of system clocks 104B to the new target fundamental frequencies.

The clock frequency controller 108B sets the bandwidth and placement of the teeth of the comb filter to correspond to the expected locations of system clock harmonics. The width of the teeth of the comb filter 110B may vary depending on the expected bandwidth or spread of the system clock harmonics.

The resulting filtered output contains energy primarily at the expected locations of the interfering clock harmonics. If the outputs of the programmable comb filters 110B are spectrally weighted by convolving them with the time-domain spectral templates 116B using convolver 112B, and the energy of the resulting signals is calculated 114B, the result may include an indication of the severity of the interference to the active channels before clocks are shifted. To predict the severity of the interference after a clock shift, the time-domain spectral penalty templates may be modulated. With properly constructed spectral penalty templates, this is approximately equivalent to shifting the clocks but without the system impact associated with a succession of rapid clock shifts. The modulators 113B shift the spectral penalty templates in increments corresponding to the clock fundamental frequency steps over which the search for optimal shift is taking place. In this way, the search for optimal clock frequencies is made without ever having to change the clock frequencies. The clock frequency controller circuitry 108B directs the search by providing spacing and tooth widths to the programmable comb filters 110B and by setting the modulation frequency of the modulators 113B. The search may be performed sequentially or simultaneously depending on the desired accuracy and computational resources available. The system clock frequencies that minimize the total predicted interference energy are then chosen as the target frequencies and reported to clock generator 126B. The clock generator is instructed to then shift the frequencies of system clocks 104B to the new targets.

Figure 2A:
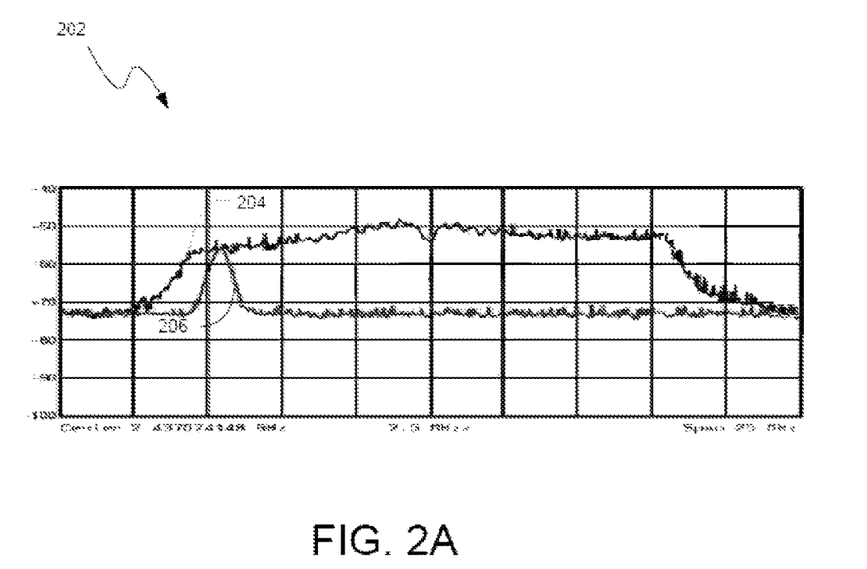
FIGS. 2A and 2B each depict signal graphs of a general overview of the present disclosure.
Figure 2B:
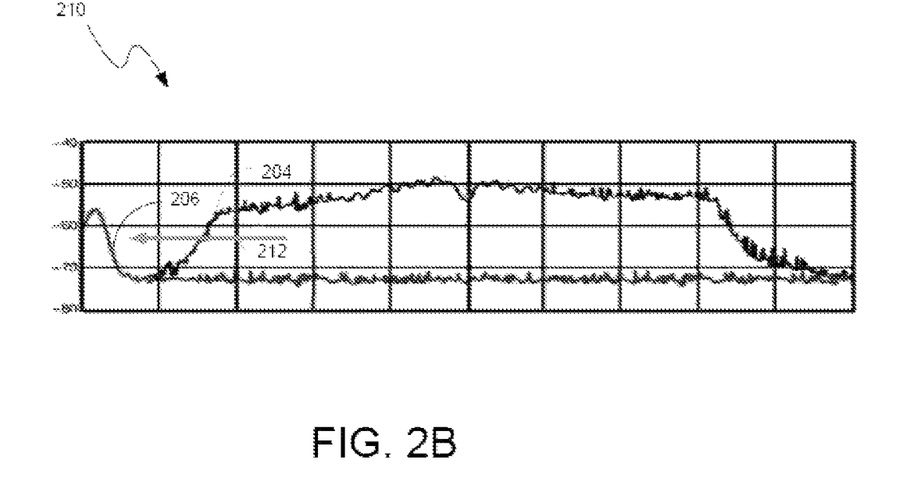

FIGS. 2A and 2B each depict signal graphs of a general overview of the present disclosure. The graph 202 of FIG. 2A depicts an active channel 204 and one clock harmonic 206. The harmonic 206 falls within the frequency range of the active channel 206, and as such, may cause interference leading to reduced bandwidth and/or range for the active channel 204. In other words, the harmonic 206 represents noise within the active channel that may degrade radio performance for the active channel. Operations according to at least one embodiment described herein may shift one or more interfering clock harmonics out of a given active channel. For example, the graph 210 of FIG. 2B depicts the clock harmonic 206 shifted out of the active channel 204, as indicated by arrow 212. The harmonic content of a given clock may be frequency shifted by adjusting the fundamental frequency of the given clock.

Figure 2C:
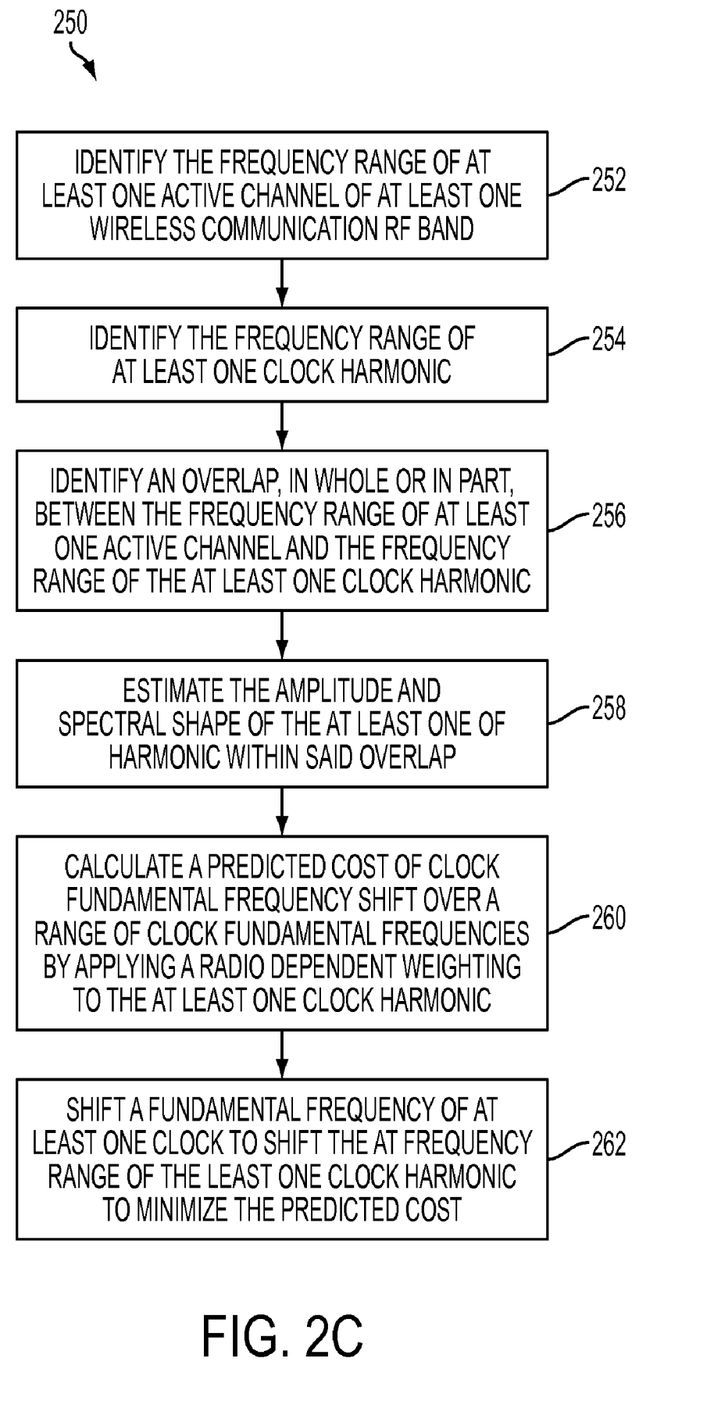
FIG. 2C is a flowchart of exemplary operations according to at least one embodiment.

FIG. 2C is a flowchart 250 of exemplary operations according to at least one embodiment. Operations according to this embodiment may include identifying the frequency range of at least one active channel of at least one wireless communication RF band 252. Operations may further include identifying the frequency range of at least one clock harmonic 254. Operations may also include identifying an overlap, in whole or in part, between the frequency range of the at least one active channel and the frequency range of the at least one clock harmonic 256. Operations may also include estimating the amplitude and spectral shape of the at least one clock harmonic within the overlap 258. Operations may include calculating a predicted cost of clock fundamental frequency shift over a range of clock fundamental frequencies by applying a radio dependent, frequency dependent weighting to the at least one clock harmonic 260. And operations may include shifting a fundamental frequency of the at least one clock to shift the frequency range of the at least one clock harmonic to minimize the predicted cost 262.

Figure 3A:
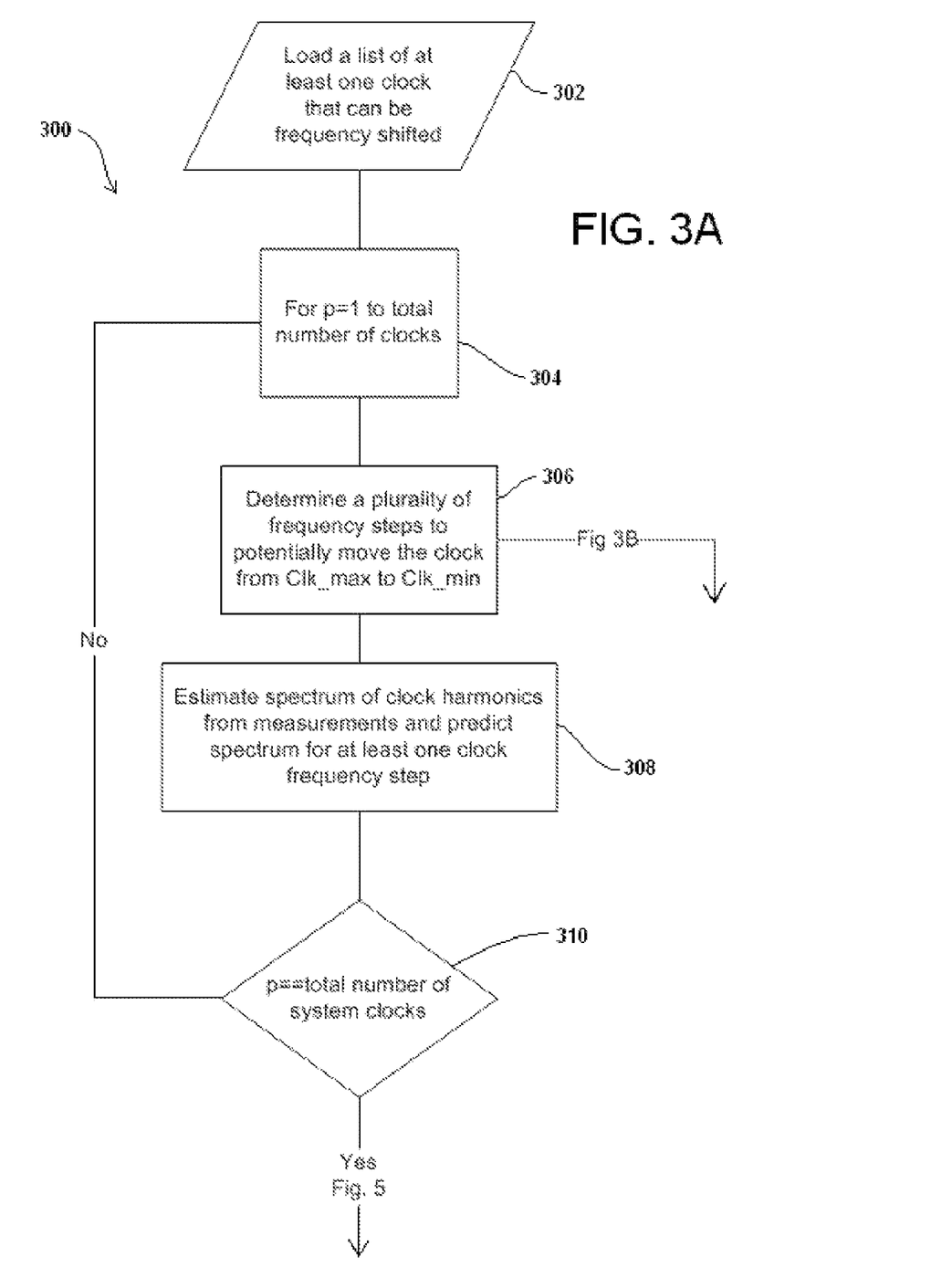
FIG. 3A illustrates a flowchart of exemplary operations to generate the harmonic content of at least one clock.

FIG. 3A illustrates a flowchart 300 of one exemplary method to identify the frequency range of at least one clock harmonic of at least one clock. The method of this embodiment may include loading a list of at least one clock that can be frequency shifted 302. Assuming that a plurality of clocks (p) are identified as being able to be frequency shifted, the method of this embodiment may be repeated for all such clocks, for p=1 to the total number of clocks (p) 304. As will be understood by those skilled in the art, a typical clock may include phase lock loop (PLL) circuitry that can adjust the frequency of a clock within a given range, e.g., Clk_max (the nominal or maximum clock frequency) to Clk_min (the minimal allowable frequency for the clock). The method of this embodiment may also include determining the total number of frequency steps to move the clock from Clk_max to Clk_min 306. The number of frequency steps within the range of Clk_max to Clk_min may be a discrete number of steps and may be based on, for example, the minimum PLL frequency increments/decrements and/or a predetermined (e.g., programmable) step size. The method of this embodiment may also include estimating a spectrum of clock harmonics from measurements and predicting a spectrum for at least one frequency step 308.

The spectrum of n clock harmonics for p clocks may be expressed by, for example, using Equation 1A below:

$$\left[ \sum_{n=1}^{N_p} \hat{A}_{p,n}(\omega) \gamma \left( \frac{n\omega_{0,p} - \omega}{n\omega_{bw,p}} \right) \right];\qquad \text{EQ. 1A}$$

where $\hat{A}_{p,n}(\omega)$ is the estimated amplitude of the $n^{th}$ harmonic of the $p^{th}$ clock, $N_p$ is the total number of clocks, and $\omega_{0,p}$ is the fundamental frequency of the $p^{th}$ clock, $\omega_{bw,p}$ is the bandwidth of the $p^{th}$ clock, $\gamma$ is a real-valued function defined over a narrow frequency range. EQ. 1A may be evaluated over the independent variable $\omega$ (frequency).

Figure 3B:
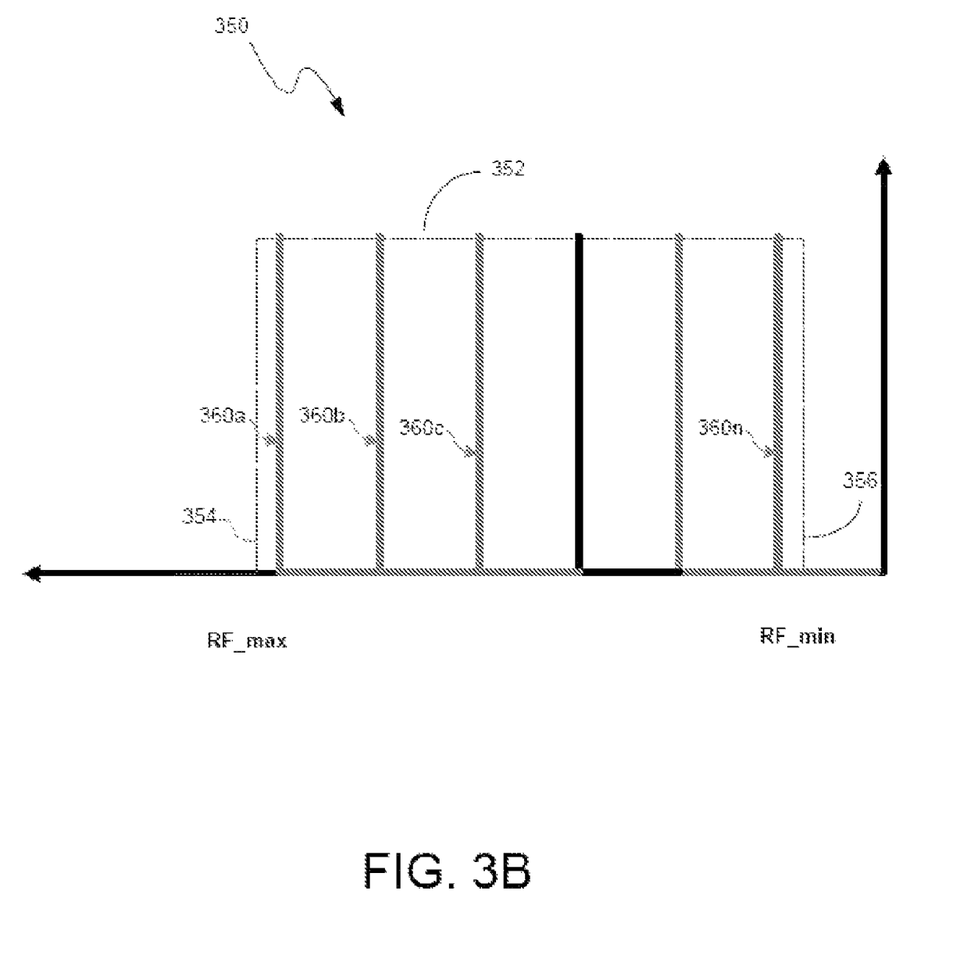
FIG. 3B depicts one exemplary spectral graph of harmonic content of a plurality of frequency steps of a clock.

FIG. 3B depicts one exemplary spectral graph 350 of harmonic content of a plurality of frequency steps of a clock. The graph 350 depicts a plurality of harmonic signals 360a, 360b, 360c, . . . , 360n. In this example, the amplitudes of the harmonics are normalized to have the same or approximately the same amplitude. However, in actuality the amplitudes of each harmonic need not be normalized. Instead, the actual harmonic content may be used or may be represented by approximate amplitude values for each harmonic (e.g., non-normalized). The graph 350 depicts harmonic content within the envelope 352 of one RF band, i.e., between a frequency RF_max 354 and RF_min 356 of a given RF band. Of course, it should be recognized that the harmonic content may be distributed outside of the RF band 352 depicted in this figure. Referring again to the method of FIG. 3A, the harmonic content for at least one frequency step for at least one clock may be determined. In a system with multiple clocks, the method of FIG. 3A may be repeated for the total number of system clocks (p) 310.

In other embodiments, one or more of the clocks 104 may operate in variable frequency mode. For example, one or more clocks 104 may comprise a spread clock in which the fundamental frequency of the clock is varied by some percentage. This may cause the harmonics to vary, e.g., become spread. For example, a spread clock may be spread by 1% at the fundamental frequency. In this case, the $100^{th}$ harmonic may be 100 times broader than the fundamental.

The spectrum of n clock harmonics for p spread clocks may be expressed by, for example, using Equation 1B:

$$\left[ \sum_{n=1}^{N_p} \hat{A}_{p,n}(\omega) \Gamma_p \left( \frac{n\omega_{0,p} - \omega}{n\omega_{bw,p}} \right) \right];\qquad \text{EQ. 1B}$$

where $\hat{A}_{p,n}(\omega)$ is the estimated amplitude of the $n^{th}$ harmonic of the $p^{th}$ clock, $N_p$ is the total number of clocks, $\omega_{0,p}$ is the fundamental frequency of the $p^{th}$ clock, $\omega_{bw,p}$ is the bandwidth of the spread of the $p^{th}$ clock, and $\Gamma_p$ defines the spreading function for the $p^{th}$ clock. EQ. 1B may be evaluated over the independent variable $\omega$ (frequency).

Figure 4A:
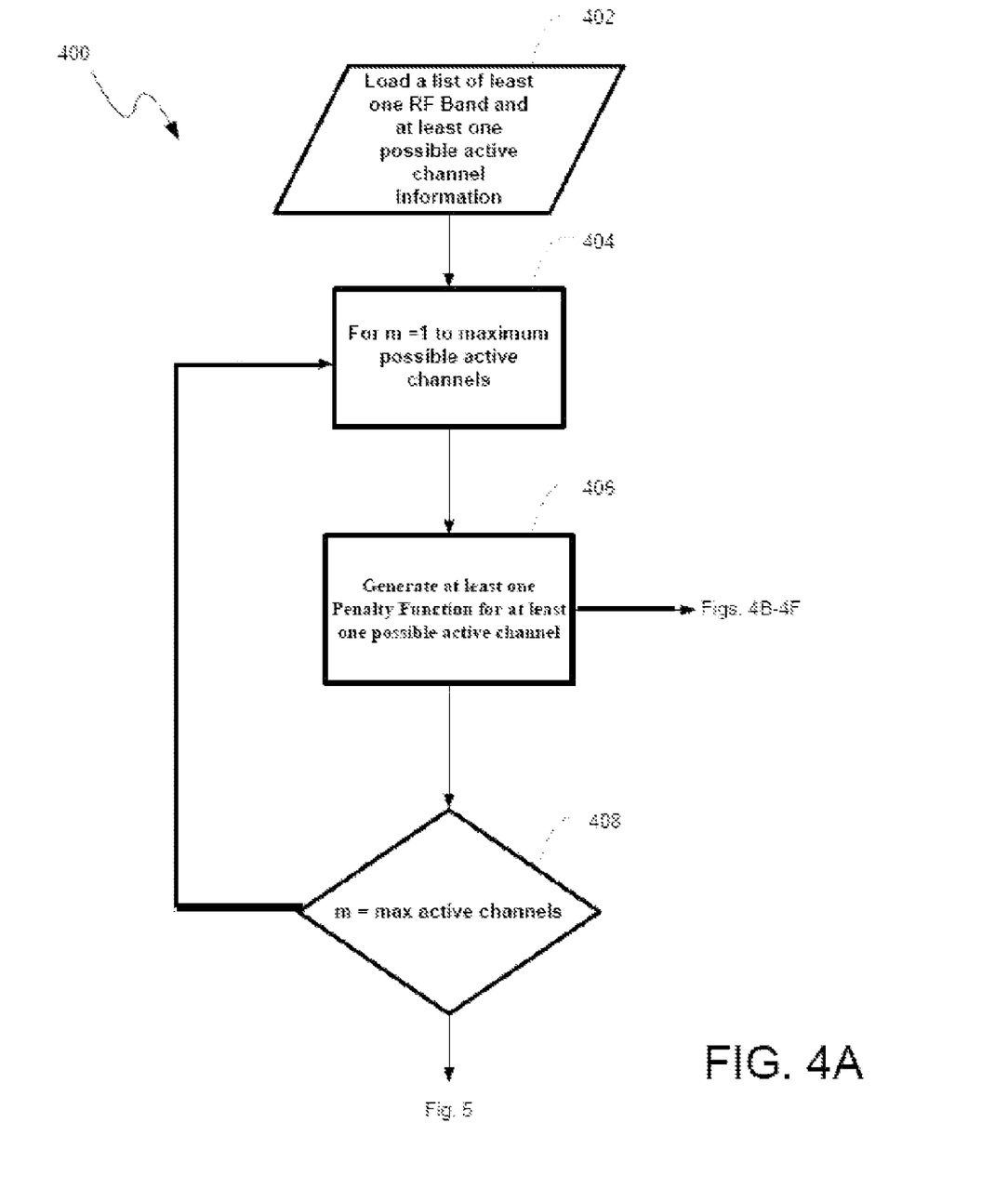
FIG. 4A illustrates a flowchart of exemplary operations to generate a penalty function for at least one active channel in at least one RF band.

In one exemplary embodiment, the frequency range of at least one active channel may be identified in terms of a penalty function for that active channel. For example, FIG. 4A illustrates a flowchart 400 of one exemplary method to generate a penalty function for at least one active channel in at least one RF band. A "penalty function", as used herein, may be defined as a function over the frequency range of an active channel that indicates the frequency-dependent performance impact of noise in that frequency range. The higher the value, the greater the impact. The penalty function may be weighted. The penalty function may be defined by, for example, the spectral power mask of a given RF channel.

To generate a penalty function, the method of this embodiment may include identifying at least one RF band and at least one possible active channel with that RF band 402. Assuming that a plurality of active channels (m) within at least one RF band are identified, the method of this embodiment may be repeated for all such possible active channels, for m=1 to the total number of possible active channels (m) 404. The method of this embodiment may also include generating at least one penalty function for at least one possible active channel 406. Herein, "generation" shall include reading from memory as well as direct calculation.

The penalty function for at least one possible active channel may be generated, for example, using Equation 2 below:

$$\left[ \sum_{m=1}^{M} \prod_{m} \left( \frac{\omega_{c,m} - \omega}{\omega_{bw,m}} \right) \right];\qquad \text{EQ. 2}$$

where $\Pi_m$ defines shape of the penalty function for the $m^{th}$ active channel (M is the total number of identified active channels), $\omega_{c,m}$ is the center frequency of the $m^{th}$ active channel, and $\omega_{bw,m}$ is the bandwidth (frequency range) of the $m^{th}$ frequency channel. EQ. 2 may be evaluated over the independent variable $\omega$ (frequency).

FIGS. 4B-4F depict exemplary penalty functions. The shape of each penalty function in FIGS. 4B-4F may be based on, for example, the modulation technique used by the RF band. Exemplary modulation techniques may include, for example, multi-carrier modulation (MCM), orthogonal frequency division multiplexing (OFDM), coded orthogonal frequency division multiplexing COFDM, constant phase frequency shift key CPFSK, dual multi-tone DMT, and/or other modulation techniques.

In addition, the shape of each penalty function may be based on, for example, the weighting factor applied to each function. Accordingly, the shape function, $\Pi_m$, may change depending on the modulation technique used for a given active channel and/or the weight applied to the spectral content of the active channel.

Figure 4B:
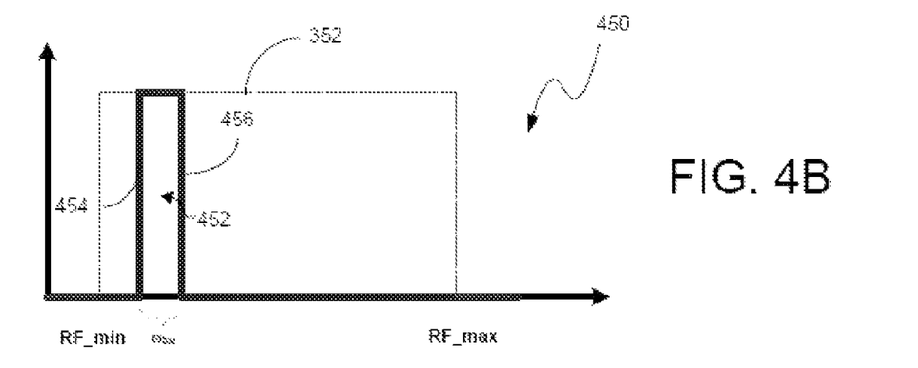
FIGS. 4B to 4F depict exemplary penalty functions according to different embodiments consistent with the present disclosure.

For example, FIG. 4B depicts a graph 450 of one exemplary penalty function 452 within one exemplary RF band 352. The penalty function 452 of this embodiment has a generally rectangular shape, defined in a frequency range between a first frequency 454 and a second frequency 456, having a bandwidth $\omega_{bw}$. The penalty function of this embodiment may be generated using the shape function $\Pi_m$. In this example, the shape function $\Pi_m$ may define a weighting scheme that weights equally those frequencies within the identified frequency range of the active channel.

Figure 4C:
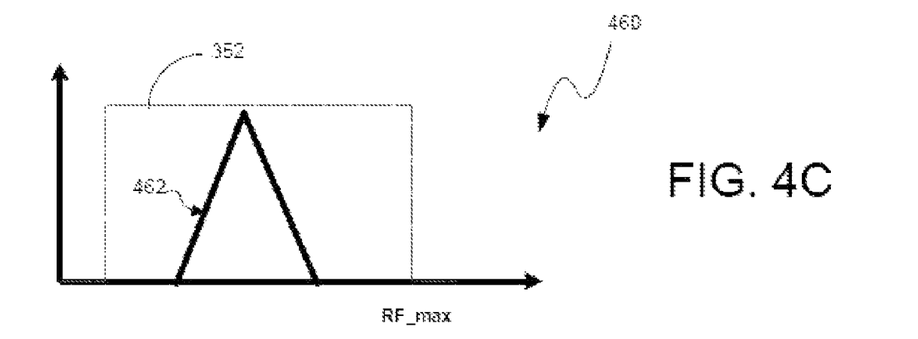

FIG. 4C depicts a graph 460 of another exemplary penalty function 462 within one exemplary RF band 352. The penalty function 462 of this embodiment has a generally triangular shape, and may be generated using a different shape function. In this example, the shape function may define a weighting scheme that weights the center frequency within the identified frequency range of the active channel more heavily than other frequencies.

Figure 4D:
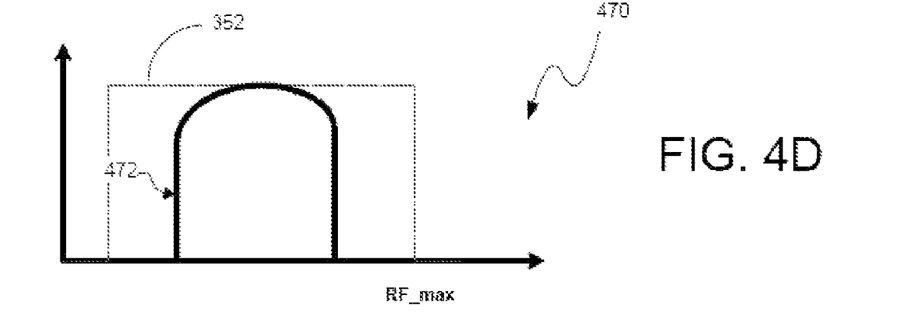

FIG. 4D depicts a graph 470 of another exemplary penalty function 472 within one exemplary RF band 352, and may be generated using yet another shape function. The penalty function 472 of this embodiment has generally rectangular shape with rounded corners. In this example, the shape function may define a weighting scheme that weights those frequencies within the identified frequency range of the active channel that are closer to the center frequency of the active channel more heavily than those outside this range.

Figure 4E:
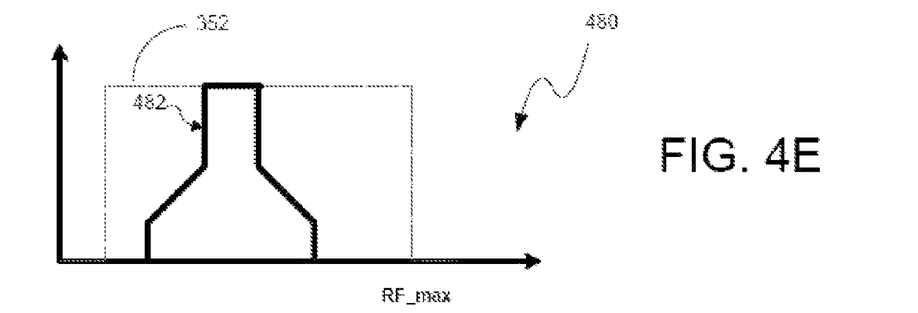

FIG. 4E depicts a graph 480 of another exemplary penalty function 482 within one exemplary RF band 352, and may be generated using still a different shape function. The penalty function 482 of this embodiment has a generally rectangular shape with a flared base and narrow upper portion. In this example, the shape function may again define a weighting scheme that weights those frequencies within the identified frequency range of the active channel that are closer to the center frequency of the active channel more heavily than those outside this range.

Figure 4F:
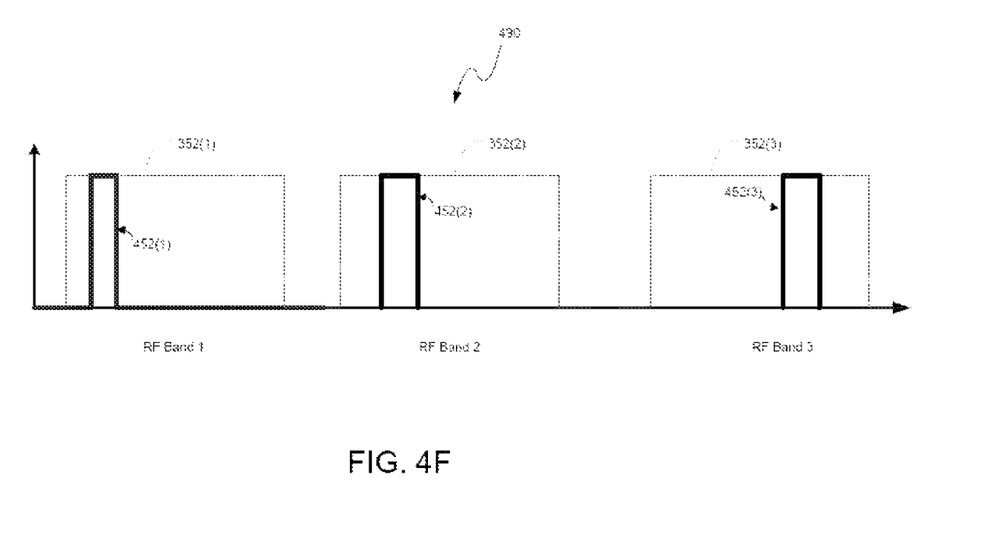

In other embodiments, more than one active channel may be present at the same time. FIG. 4F depicts one exemplary graph 490 of a penalty function that includes three active channels 452(1) in RF Band 1 352(1), 452(2) in RF Band 2 352(2), and 452(3) in RF Band 3 352(3). Of course, the individual shapes of each of the active channels may be different, for example, as shown in FIGS. 4B-4D.

Referring again to the method of FIG. 4A, in a system with a plurality of possible active RF channels, the penalty function for each possible active channel (m) may be generated 408.

Once the harmonic content of at least one clock is identified, as described above with reference to FIGS. 3A-3B, and a penalty function of at least one possible active channel is identified, as described above with reference to FIGS. 4A-4E, a method according to yet another embodiment may include identifying an overlap, in whole or in part, between the frequency range of the at least one active channel and the frequency range of the at least one clock harmonic and shifting a fundamental frequency of the at least one clock to shift the frequency range of the at least one clock harmonic out of, at least in part, the frequency range of the active channel. When there is more than one active channel, this may result in the shifting of at least one clock harmonic into, at least in part, the frequency range of another active channel. However, the total interference cost will be reduced.

To identify an overlap between at least one clock harmonic of at least one clock and at least one active channel, the method of this embodiment may include evaluating a cost function for at least one frequency step of at least one clock with respect to a penalty function of a possible active channel.

Figure 5A:
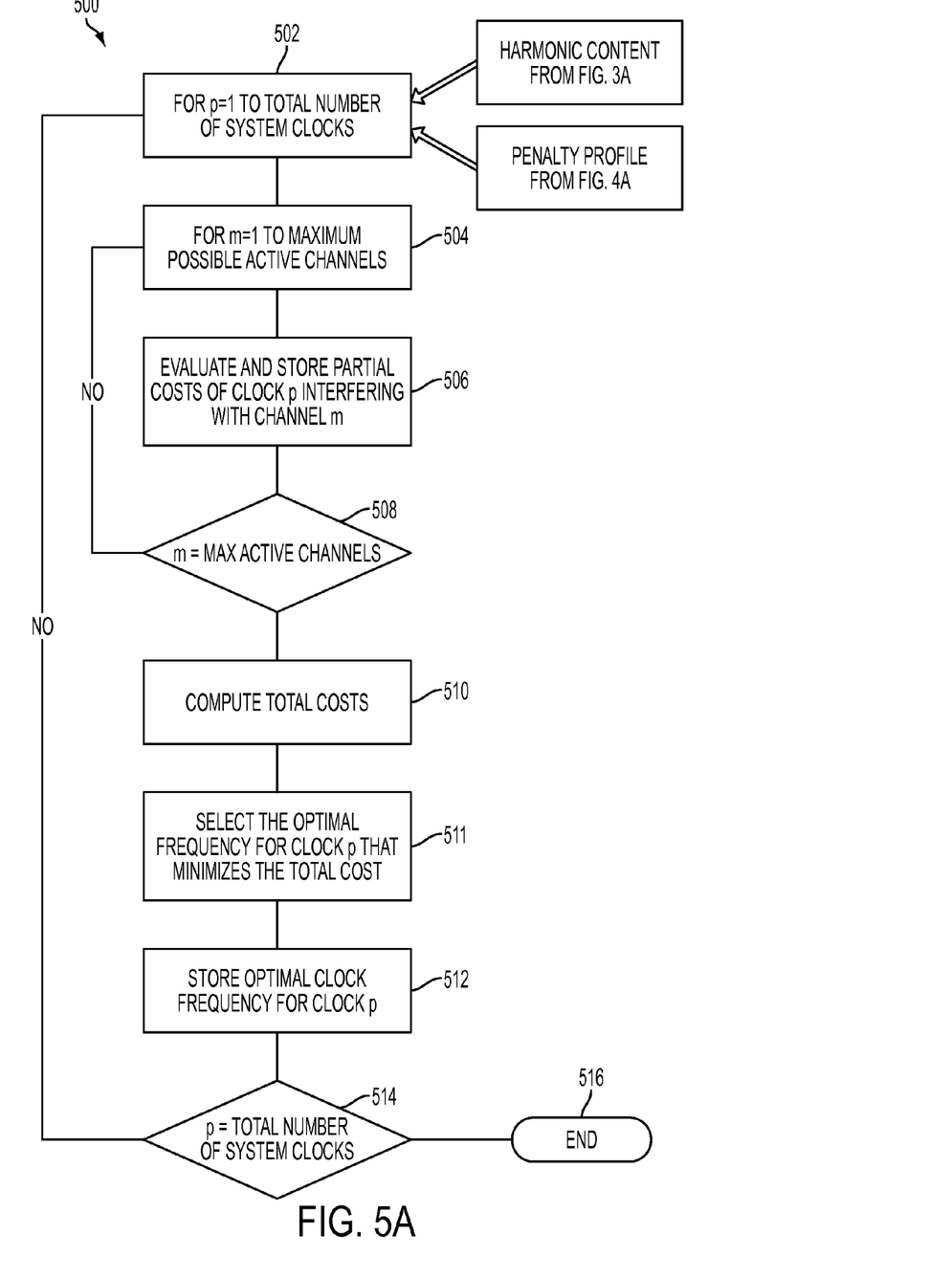
FIG. 5A illustrates a flowchart for selecting the optimal clock frequency that minimizes the total cost according to one embodiment consistent with the present disclosure.

FIG. 5A illustrates a flowchart 500 for evaluating a cost function. As used herein, a "cost function" may be defined as a function which predicts the amount of impairment of radio performance due to RFI (noise) given one or more clock harmonics overlapping with the frequency ranges of one or more active channels. The value of the cost function, the cost, may be dependent on the number of clock harmonics that overlap, in whole or in part, with the penalty function for a given active channel.

Using the harmonic spectrum of a given clock (FIG. 3A) and at least one penalty function of a given RF channel (FIG. 4A), and assuming that a plurality of clocks (p) are identified as being able to be frequency shifted, the method of this embodiment may be repeated for all such clocks, for p=1 to the total number of clocks (p) 502 (FIG. 5A).

Assuming that a plurality of active channels (m) within at least one RF band are identified, the method of this embodiment may be repeated for all such possible active channels, for m=1 to the total number of possible active channels (m) 504. The method of this embodiment may also include evaluating a cost function $C(\omega_0)$ for at least one frequency step of at least one clock 506.

In one exemplary embodiment, the operation 506 may include evaluating a cost function $C(\omega_0)$ for a plurality of frequency steps to move the clock from Clk_max to Clk_min.

The cost function for at least one clock and at least one possible active channel may be evaluated, for example, using Equation 3A below:

$$C(\omega_0) = \int \sum_{p=1}^{P} \left[ \sum_{n=1}^{N_p} \hat{A}_{p,n}(\omega) \delta(n\omega_{0,p} - \omega) \right] \left[ \sum_{m=1}^{M} \prod_{m} \left( \frac{\omega_{c,m} - \omega}{\omega_{bw,m}} \right) \right] d\omega \qquad \text{EQ. 3A}$$

where $C(\omega_0)$ represents the cost of harmonics residing within the frequency ranges of the active channels. EQ. 3A may be evaluated over the independent variable $\omega_0$ (clock fundamental frequency).

In other embodiments, where at least one clock is a spread spectrum clock, the cost function for at least one clock and at least one possible active channel may be evaluated, for example, using Equation 3B below:

$$C(\omega_0) = \int \sum_{p=1}^{P} \left[ \sum_{n=1}^{N_p} \hat{A}_{p,n}(\omega) \Gamma_p \left( \frac{n\omega_{0,p} - \omega}{n\omega_{bw,p}} \right) \right] \left[ \sum_{m=1}^{M} \prod_{m} \left( \frac{\omega_{c,m} - \omega}{\omega_{bw,m}} \right) \right] d\omega \qquad \text{EQ. 3B}$$

EQ. 3B may be evaluated over the independent variable $\omega_0$ (clock fundamental frequency).

Of course, the operations of this embodiment may be iteratively generated over each frequency step and for each clock (p) and each active channel (m) identified.

Figure 5B:
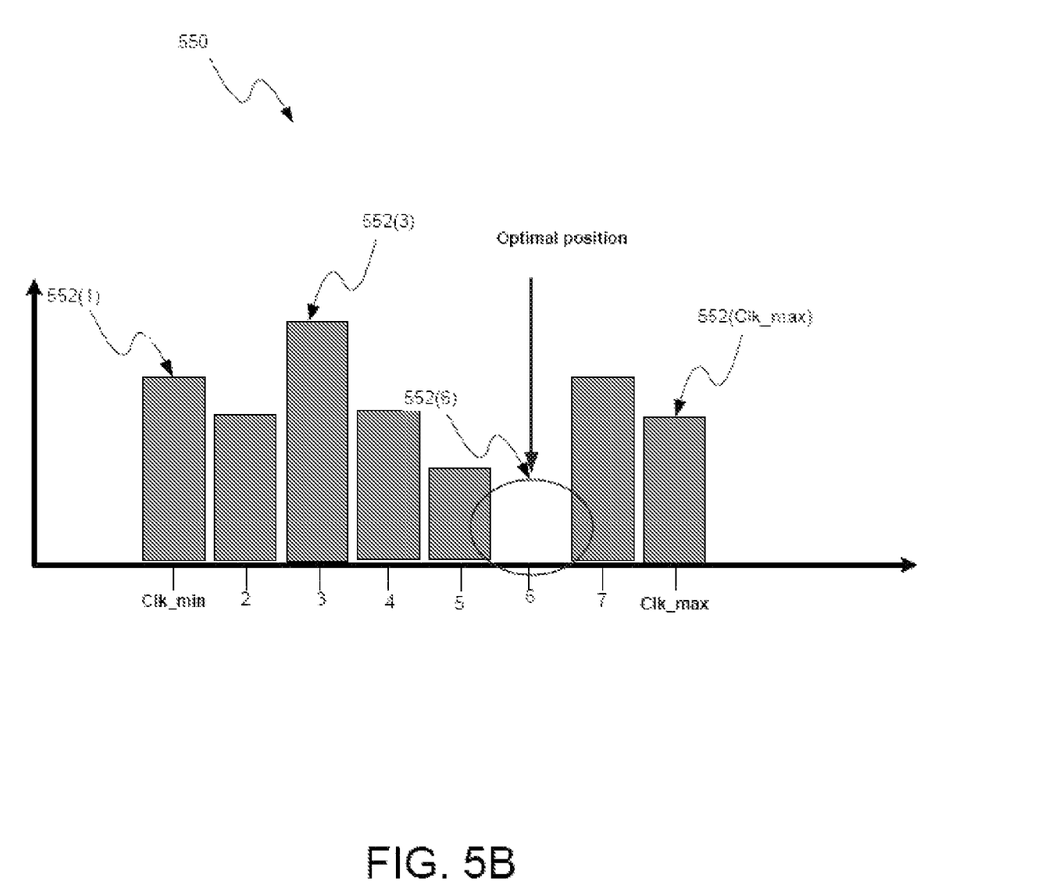
FIG. 5B depicts a graph showing one representative cost function evaluated at several clock frequencies.

FIG. 5B depicts a graph showing one representative cost function evaluated at several clock frequencies to generate a plurality of costs. A plurality of costs 552(1), 552(3), 552(6), ..., 552(Clk_max) may be generated, one for each frequency step of a clock, e.g., steps from Clk_min, 2, 3, 4, 5, 6, 7, ..., Clk_max. The value (amplitude) of a given cost may be indicative of at least one harmonic, in whole or in part, within an active channel, i.e., an overlap, in whole or in part, between a given harmonic and an active channel.

In this example, cost 552(6) corresponding to clock frequency 6 indicates a cost function having a null value, which may indicate that no harmonics of the given clock reside within the active channel.

Referring again to FIG. 5A, the method of this embodiment may include selecting the optimal clock frequency that minimizes the cost 511. Here an "optimal clock frequency" may be estimated by selecting the lowest cost function value for a frequency nearest to Clk_max. By selecting a clock frequency nearest to Clk_max, the frequency of the clock may be maximized while reducing or eliminating RFI in an active channel. In the example of FIG. 5B, the optimal clock frequency for a given clock may reside at frequency step 6, having a cost 552(6) of zero value. Of course, in other embodiments, the optimal clock frequency may be selected based on the lowest cost function value alone, and/or other system considerations.

In operation, and referring again to the system 100 of FIG. 1, active RF channel detection circuitry 106 may be configured to detect one or a plurality of active channels. Clock frequency controller circuitry 108 may be configured to receive the current active channel information (from circuitry 106) and to read the interference cost to determine the optimal clock frequency for a given clock for a given one or a plurality of active channels. Based on the information provided by active RF channel detection circuitry 106 and the template combiner 122, clock frequency controller circuitry 108 may be configured to set the clock frequency of one or more clocks 104 to reduce or eliminate RFI in a given active RF channel, or a given plurality of active RF channels.

This system has the advantage that when new radios are added to the system, the system clocks may be automatically adjusted for minimum interference. Moreover, when new wireless signaling schemes become available, a clock controller firmware update may be all that is needed to ensure continued optimal performance with the new wireless network standards.

This system helps to ensure that future multi-radio computing platforms perform better in terms of extending radio range, minimizing power required to achieve a given range, increasing throughput at a given range, and increasing the number of wireless platforms that can co-exist in a given spatial location without interfering with one another. Moreover, this system ensures low impact of platform RFI upon radio performance.

Advantageously, the systems, methods and apparatus described herein may offer enhanced RFI mitigation over conventional approaches. Further advantageously, the systems, methods and apparatus described herein may provide a comprehensive RFI-reducing scheme by adaptively managing a plurality of system clocks that may cause RFI with one or more active RF channels. Further, the systems, methods and apparatus described herein may take advantage of clock-adjustment without requiring expensive add-on circuitry and/or shielding which may increase the size and/or overall cost of some wireless platforms.

As stated, the at least one wireless network radio receiver 102 may be configured for wireless communication using, for example 802.11a/b/g, Bluetooth, UWB, WiFi, WiMax, and/or other wireless communication protocols. If an 802.11a/b/g wireless communications protocol is used by one or more wireless network receivers 102, it may comply or be compatible with the protocol described in "ANSI/IEEE 802.11, 1999 Edition", as published by LAN MAN Standards Committee of the IEEE Computer Society (Reaffirmed 12 Jun. 2003). If a Bluetooth wireless communications protocol is used by one or more wireless network receivers 102, it may comply or be compatible with the protocol described in the "802.15.1™ IEEE Standard For Information Technology—Telecommunications and Information Exchange Between Systems—Local and Metropolitan Area Networks," Part 15.1, Version 1.1, published Jun. 14, 2005 by the IEEE Computer Society. If a UWB (Ultra Wideband) wireless communications protocol is used by one or more wireless network receivers 102, it may comply or be compatible with the protocol described in "High Rate Ultra Wideband PHY and MAC Standard," 1$^{st}$ Edition, December 2005, published by EMCA International. If a WiMax wireless communications protocol is used by one or more wireless network receivers 102, it may comply or be compatible with the protocol described in "IEEE 802.16-2004", published Oct. 1, 2004 by the IEEE WiMax Committee. Of course, the communications protocol used by one or more wireless network receivers 102 may comply with earlier and/or later versions of these standards.

One or more of the components of the system of FIG. 1 may be embodied in one or more integrated circuits (ICs). "Integrated circuit", as used herein, may mean a semiconductor device and/or microelectronic device, such as, for example, a semiconductor integrated circuit chip. "Circuitry", as used in any embodiment herein, may comprise, for example, singly or in any combination, hardwired circuitry, programmable circuitry, state machine circuitry, and/or firmware that stores instructions executed by programmable circuitry.

Embodiments of the present disclosure may be implemented in a computer program that may be stored on a storage medium having instructions to program a system (e.g., computer system and/or a machine and/or processor) to perform the methods. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

Various features, aspects, and embodiments have been described herein. The features, aspects, and numerous embodiments described herein are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents

What is claimed is:

1. A method for mitigating clock-generated radio frequency interference in wireless mobile computing platforms comprising:
    identifying, using active radio frequency (RF) channel detection circuitry, a frequency range of at least one active channel of at least one wireless radio channel;
    identifying a frequency range of at least one clock harmonic;
    identifying an overlap, in whole or in part, between the frequency range of said at least one active channel and the frequency range of said at least one clock harmonic;
    estimating one or more of an amplitude, frequency, or spectral shape of said at least one clock harmonic within said overlap;
    calculating a predicted cost of a fundamental frequency shift over a range of clock fundamental frequencies by applying a radio-dependent weighting to said at least one clock harmonic; and
    shifting a fundamental frequency of at least one clock to shift the frequency range of said at least one clock to minimize said predicted cost to reduce interference in said one or more active radio channels.

2. The method of claim 1 wherein said identifying the frequency range of at least one active channel comprises generating a penalty function for each said active channel.

3. The method of claim 2 wherein said identifying the frequency range of at least one active channel is repeated for all active channels.

4. The method of claim 3 wherein a weighting factor is applied to each of said penalty functions to indicate the relative importance of interference upon the corresponding active channel.

5. An article comprising a machine-readable storage medium containing instructions that if executed enable a system to:
   identify a frequency range of at least one active channel of at least one wireless communication RF band;
   identify a frequency range of at least one clock harmonic;
   identify an overlap, in whole or in part, between the frequency range of the at least one active channel and the frequency range of the at least one clock harmonic;
   estimate one or more of an amplitude, frequency, or spectral shape of the at least one clock harmonic within said overlap;
   calculate a predicted cost of clock fundamental frequency shift over a range of clock fundamental frequencies by applying a radio dependent weighting to the at least one clock harmonic; and
   shift a fundamental frequency of the at least one clock to shift the frequency range of the at least one clock harmonic to minimize the predicted cost.

6. The article of claim 5 wherein said frequency range of at least one active channel is identified by generating a penalty function for each said active channel.

7. The article of claim 6 wherein said frequency range of at least one active channel is identified for all active channels.

8. The article of claim 7 further containing instructions that if executed enable a system to apply a weighting factor to each of said penalty functions to indicate the relative importance of interference upon the corresponding active channel.

9. A method for mitigating clock-generated radio frequency interference in wireless mobile computing platforms comprising:
   identifying one or more system clocks;
   identifying, using active radio frequency (RF) channel detection circuitry, one or more active radio channels;
   measuring clock harmonics in or near said one or more active radio channels;
   determining potential interference occurring if said one or more system clocks were moved to one or more new fundamental frequencies;
   wherein said determining potential interference comprises predicting new clock harmonics from existing clock harmonics; and
   shifting one or more clock fundamental frequencies to reduce interference to said one or more active radio channels based on existing interference and said potential interference of a plurality of new fundamental frequencies.

10. The method of claim 9 wherein said measuring comprises narrowband spectral analysis.

11. The method of claim 10 wherein said measuring comprises comb filtering.

12. The method of claim 10 wherein said measuring comprises estimating one or more of the frequency, spectral shape, or amplitude of clock harmonics.

13. The method of claim 9 wherein said predicting new clock harmonics comprises one or more of extrapolating or interpolating measured values.

14. The method of claim 9 wherein said shifting one or more clock fundamental frequencies comprises evaluating a cost function and choosing its minimum.

15. The method of claim 14 wherein said cost function comprises a penalty profile comprising a radio-dependent, frequency-dependent weighting of said measured clock harmonics.

16. The method of claim 15 wherein said penalty profile for each active channel is weighted by an importance of that channel.

17. The method of claim 15 wherein said penalty profile for each active channel is weighted by an importance of a radio associated therewith.

18. The method of claim 17 wherein said penalty profile is dependent on a modulation technique used by said radio.

19. The method of claim 9 wherein said shifting one or more clock fundamental frequencies comprises minimizing the predicted energy of the clock harmonics within said active channels.

* * * * *